United States Patent
Lassalle-Balier et al.

(10) Patent No.: US 10,605,874 B2
(45) Date of Patent: Mar. 31, 2020

(54) MAGNETIC FIELD SENSOR WITH MAGNETORESISTANCE ELEMENTS HAVING VARYING SENSITIVITY

(71) Applicant: Allegro MicroSystems, LLC, Manchester, NH (US)

(72) Inventors: Rémy Lassalle-Balier, Bures sur Yvette (FR); Jeffrey Eagen, Manchester, NH (US); Andrea Foletto, Annecy le Vieux (FR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/055,644

(22) Filed: Aug. 6, 2018

(65) Prior Publication Data

US 2020/0041584 A1 Feb. 6, 2020

(51) Int. Cl.
*G01R 33/09* (2006.01)
*H03K 17/97* (2006.01)
(Continued)

(52) U.S. Cl.
CPC .......... *G01R 33/093* (2013.01); *G01D 5/145* (2013.01); *G01R 33/0005* (2013.01);
(Continued)

(58) Field of Classification Search
CPC .......... G01R 33/093; G01R 33/0005; G01R 33/091; G01R 33/096; G01R 33/098; G01D 5/145; H03K 17/97
(Continued)

(56) References Cited

U.S. PATENT DOCUMENTS 5,731,702 A  3/1998  Schroeder et al.
5,861,747 A *  1/1999  Kubinski ................. G01B 7/30
                                           324/207.21
(Continued)

FOREIGN PATENT DOCUMENTS

DE    198 39 446 A1   3/2000
EP    2891893         7/2015
(Continued)

OTHER PUBLICATIONS

Notice of Allowance dated Mar. 22, 2019 for U.S. Appl. No. 16/136,692; 10 Pages.
(Continued)

*Primary Examiner* — Melissa J Koval
*Assistant Examiner* — Trung Nguyen
(74) *Attorney, Agent, or Firm* — Daly, Crowley, Mofford & Durkee, LLP (57) ABSTRACT

A magnetic field sensor includes a substrate having a surface and a plurality of magnetoresistance elements supported by the surface of the substrate. Each magnetoresistance element has a respective width parallel to the surface, and each width may be a smallest dimension parallel to the surface. A first width of a first magnetoresistance element of the plurality of magnetoresistance elements may be different from a second width of a second magnetoresistance element of the plurality of magnetoresistance elements. A processing circuit may be coupled to the plurality of magnetoresistance elements to receive a signal representing a detected magnetic field from at least one of the magnetoresistance elements.

19 Claims, 8 Drawing Sheets

(51) Int. Cl.
*G01R 33/00* (2006.01)
*G01D 5/14* (2006.01)

(52) U.S. Cl.
CPC ......... *G01R 33/091* (2013.01); *G01R 33/096* (2013.01); *G01R 33/098* (2013.01); *H03K 17/97* (2013.01)

(58) Field of Classification Search
USPC .......... 324/200, 300, 301, 319, 205, 207.21, 324/210–219, 228, 232, 244–263, 500, 324/529, 750.12, 750.21, 754.17, 754.29
See application file for complete search history.

(56) References Cited

U.S. PATENT DOCUMENTS

| | | | |
|---|---|---|---|
| 6,169,396 | B1 | 1/2001 | Yokotani et al. |
| 6,486,659 | B1 | 11/2002 | Schroeder |
| 6,498,482 | B2 | 12/2002 | Schroeder |
| 7,768,083 | B2 | 8/2010 | Doogue et al. |
| 7,777,607 | B2 | 8/2010 | Taylor et al. |
| 7,924,534 | B2 | 4/2011 | Grimm et al. |
| 8,248,063 | B2 | 8/2012 | Zhou et al. |
| 8,629,520 | B2 | 1/2014 | Doogue et al. |
| 8,791,692 | B2 | 7/2014 | Furukawa et al. |
| 8,878,531 | B2 | 11/2014 | Ausserlechner et al. |
| 8,952,471 | B2 | 2/2015 | Doogue et al. |
| 9,082,957 | B2 | 7/2015 | Doogue et al. |
| 9,891,293 | B2 | 2/2018 | Kawakami et al. |
| 2010/0106452 | A1* | 4/2010 | Tatenuma ............ G01D 5/2451 702/150 |
| 2011/0062537 | A1 | 3/2011 | Oh et al. |
| 2014/0111195 | A1 | 4/2014 | Kuo et al. |
| 2015/0022196 | A1 | 1/2015 | Hebiguchi et al. |
| 2015/0192648 | A1 | 7/2015 | Campiglio et al. |
| 2017/0108536 | A1 | 4/2017 | Hebiguchi |
| 2017/0184635 | A1 | 6/2017 | Ugge et al. |
| 2017/0254863 | A1 | 9/2017 | Eagen et al. |

FOREIGN PATENT DOCUMENTS

| | | |
|---|---|---|
| JP | 2004132790 | 4/2004 |
| WO | WO 2012070337 | 5/2012 |
| WO | WO 2017/151396 A1 | 9/2017 |
| WO | WO 2017/199519 | 11/2017 |

OTHER PUBLICATIONS

U.S. Appl. No. 16/136,692, filed Sep. 20, 2018, Eagen et al.
Notice of Allowance dated Jul. 13, 2018 for U.S. Appl. No. 15/061,190; 8 pages.
Response to U.S. Office Action dated Feb. 23, 2018 for U.S. Appl. No. 15/061,190; Response filed Apr. 17, 2018; 12 pages.
U.S. Non-Final Office Action dated Feb. 23, 2018 for U.S. Appl. No. 15/061,190; 21 pages.
Response to U.S. Office Action dated Sep. 8, 2017 for U.S. Appl. No. 15/061,190; Response filed Oct. 12, 2017; 13 pages.
U.S. Non-Final Office Action dated Sep. 8, 2017 for U.S. Appl. No. 15/061,190; 14 pages.
PCT International Search Report and Written Opinion dated May 22, 2017 for PCT Application No. PCT/US2017/019197; 13 pages.
PCT International Preliminary Report on Patentability dated Sep. 13, 2018 for PCT Application No. PCT/US2017/019197; 7 pages.
EP Response to Official Communication filed on Apr. 26, 2019 for EP Pat. Appl. No. EP17709292.1; 25 pages.
Search Report and Written Opinion dated Dec. 3, 2019 for PCT Application No. PCT/US2019/042921; 15 pages.
European 161/162 Communication dated Oct. 16, 2018 for European Application No. 17709292.1; 3 Pages.
U.S. Ex Parte Quayle Action dated Oct. 29, 2018 for U.S. Appl. No. 16/136,692; 9 Pages.
Response to U.S. Ex Parte Quayle Action dated Oct. 29, 2018 for U.S. Appl. No. 16/136,692; Response filed Dec. 6, 2018; 11 Pages.

* cited by examiner

MAGNETIC FIELD SENSOR WITH MAGNETORESISTANCE ELEMENTS HAVING VARYING SENSITIVITY

FIELD

This disclosure relates to magnetic field sensors and, in particular, magnetic field sensors having magnetoresistive elements with varying sensitivities.

BACKGROUND

Magnetic field sensing elements can be used in a variety of applications. Often, a magnetic field sensing element is used to detect motion (e.g., rotation) of an object, such as a gear or ring magnet. A magnetic field affected by motion of the object may be detected by one or more magnetic field sensing elements, such as Hall effect elements and/or magnetoresistance elements, which provide a signal representing the detected field. Motion of the object may, for example, result in variations in an air gap between the object (or target features of the object) and the magnetic field sensing elements. This may result in variations in the magnetic field as detected by the magnetic field sensing elements and the signals they produce. The signals can be processed to detect position, proximity, speed and/or direction of motion of the object, for example.

Various parameters characterize the performance of magnetic field sensing elements and circuits or sensors that use magnetic field sensing elements. These parameters include sensitivity, which corresponds to a rate of change in a resistance of a magnetoresistance element or a change in an output voltage from a Hall effect element in response to a change in the detected magnetic field. The parameters also include linearity, which is a measurement of how linear the output of the magnetic field sensing element is in response to a linearly changing magnetic field.

SUMMARY

In an embodiment, a magnetic field sensor includes a substrate having a surface and a plurality of magnetoresistance elements supported by the surface of the substrate. Each magnetoresistance element has a respective width parallel to the surface, and each width may be a smallest dimension parallel to the surface. A first width of a first magnetoresistance element of the plurality of magnetoresistance elements may be different from a second width of a second magnetoresistance element of the plurality of magnetoresistance elements. A processing circuit may be coupled to the plurality of magnetoresistance elements to receive a signal representing a detected magnetic field from at least one of the magnetoresistance elements.

In another embodiment, a system includes a target and a magnetic field sensor. The magnetic field sensor includes a substrate, a first magnetoresistance element having a first width providing a first magnetic sensitivity, and a second magnetoresistance element having a second width providing a second magnetic sensitivity. The first width is different than the second width and the first sensitivity different than the second sensitivity. The first and second widths may be the smallest respective dimensions parallel to a surface of a substrate. A processing circuit may be coupled to the plurality of magnetoresistance elements to receive a signal representing a detected magnetic field from at least one of the first or second magnetoresistance elements. The first magnetoresistance element may be positioned with a first distance between the first magnetoresistance element and the ferromagnetic target and a second distance between the second magnetoresistance element and the target.

In another embodiment, a magnetic field sensor comprises a substrate having a surface and detection means for detecting a magnetic field. The detection means are configured to detect the magnetic field with varying sensitivity.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

The term "magnetic field sensing element" is used to describe a variety of electronic elements that can sense a magnetic field. The magnetic field sensing element can be, but is not limited to, a Hall Effect element, a magnetoresistance element ("MR element"), or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

The term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

The terms "target" and "magnetic target" are used to describe an object to be sensed or detected by a magnetic field sensor or magnetic field sensing element.

Figure 1:
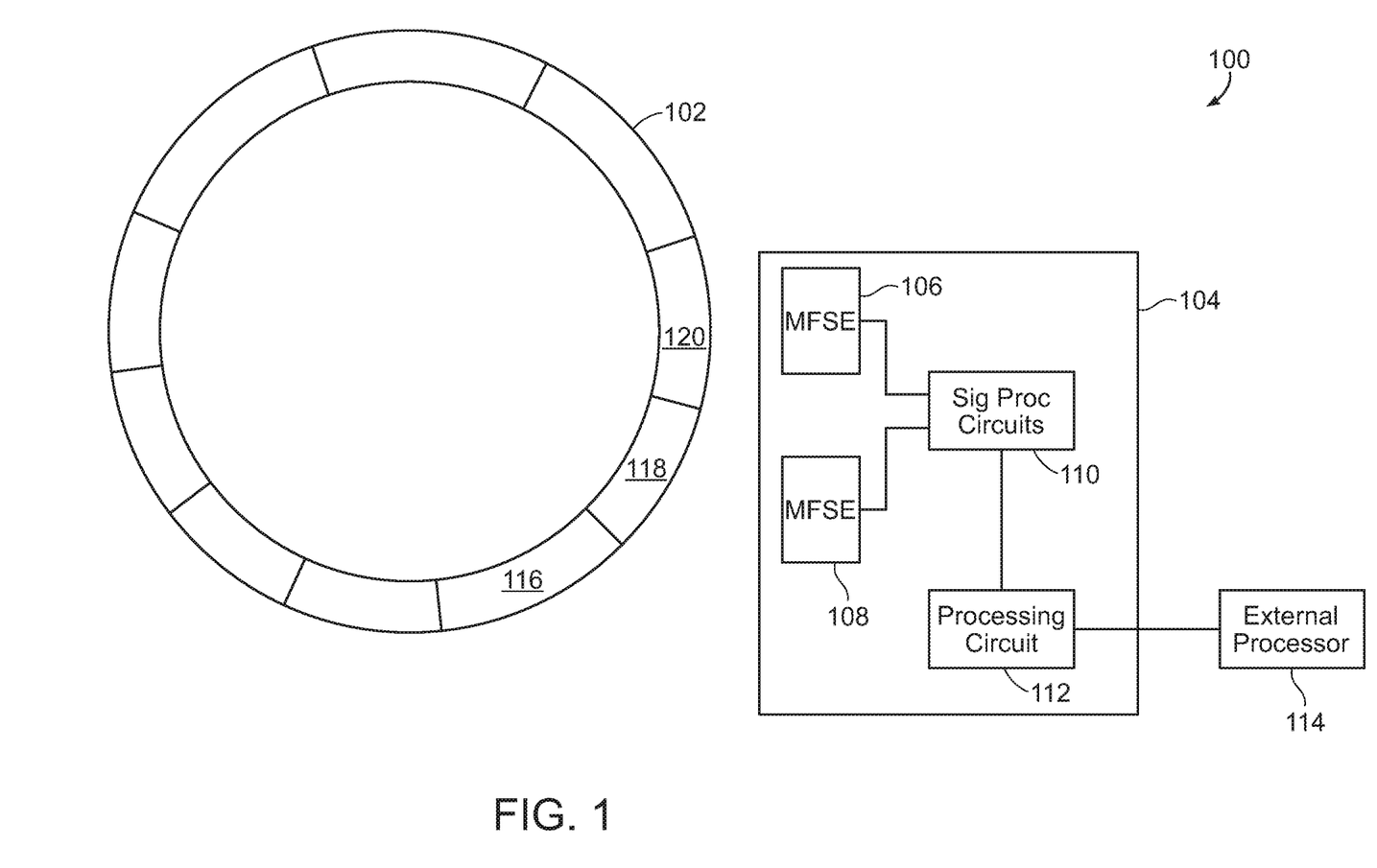
FIG. 1 is a block diagram of a system including a magnetic field sensor.

FIG. 1 is a block diagram of a system 100 for detecting a target 102. System 100 includes a magnetic field sensor 104 comprising magnetic field sensing elements 106 and 108 positioned in space relation to each other to detect target 102. Although shown as single blocks, magnetic field sensing elements 106 and 108 may each represent multiple magnetic field sensing elements that are part of magnetic field sensor 104. For example, magnetic field sensing elements 106 and 108 may each represent one or more bridge circuits each comprising four MR elements.

Magnetic field sensor 100 may also include signal processing circuitry 110 and processing circuitry 112. Signal processing circuitry may include various analog and/or digital circuits designed to shape the signals received from magnetic field sensing elements 106 and 108. These may include filters, analog-to-digital converters (ADCs), digital-to-analog converters (DACs), amplifiers, and the like. Processing circuitry 112 may include circuits that use the processed signals to perform computations to determine a state of target 102. This may include determining speed, position, direction of rotation, or other properties of target 102. Processing circuitry 112 may also include communication circuits to communicate the state of target 102 to an external device, such as external processor 114.

In FIG. 1, target 102 is shown as a ring magnetic having alternating segments 116, 118, 120, etc. The alternating segments may have alternating polarities. For example, segment 116 may have a north polarity, segment 118 may have a south polarity, segment 120 may have a north polarity, etc. In embodiments, one or more of the segments may be non-magnetic. For example, segments 116, 118, 120 may have the polarities north, none, south, respectively.

Target 102 need not be a ring magnet. In other embodiments, target 102 may be rod or linear magnet, a magnetic or non-magnetic toothed gear, etc. In certain embodiments, magnetic field sensor 100 may include a magnetic source such as a coil or permanent magnet (not shown). These so-called back-bias magnetic sources may create a magnetic field. As target 102 moves within the back-bias magnetic field, it may cause perturbations in the field. Magnetic field sensor 104 may detect these perturbations and calculate a state of target 102.

Magnetic field sensors are ubiquitous in electromechanical systems and system 100 may be used in various applications, ranging from robotics to mobile navigation systems, to automotive systems, to video gaming systems. To illustrate an automotive example, target 102 may be placed around or on the end of a rotating body, such as a wheel bearing. Magnetic field sensor 104 may be mounted near the wheel bearing to detect rotation of the wheel and may send signals about the wheel's motion to the vehicle's computer. The computer may then adjust the vehicle's operation based on the wheel's motion by, for example, engaging the antilock braking or traction stability systems when required.

Figure 2:
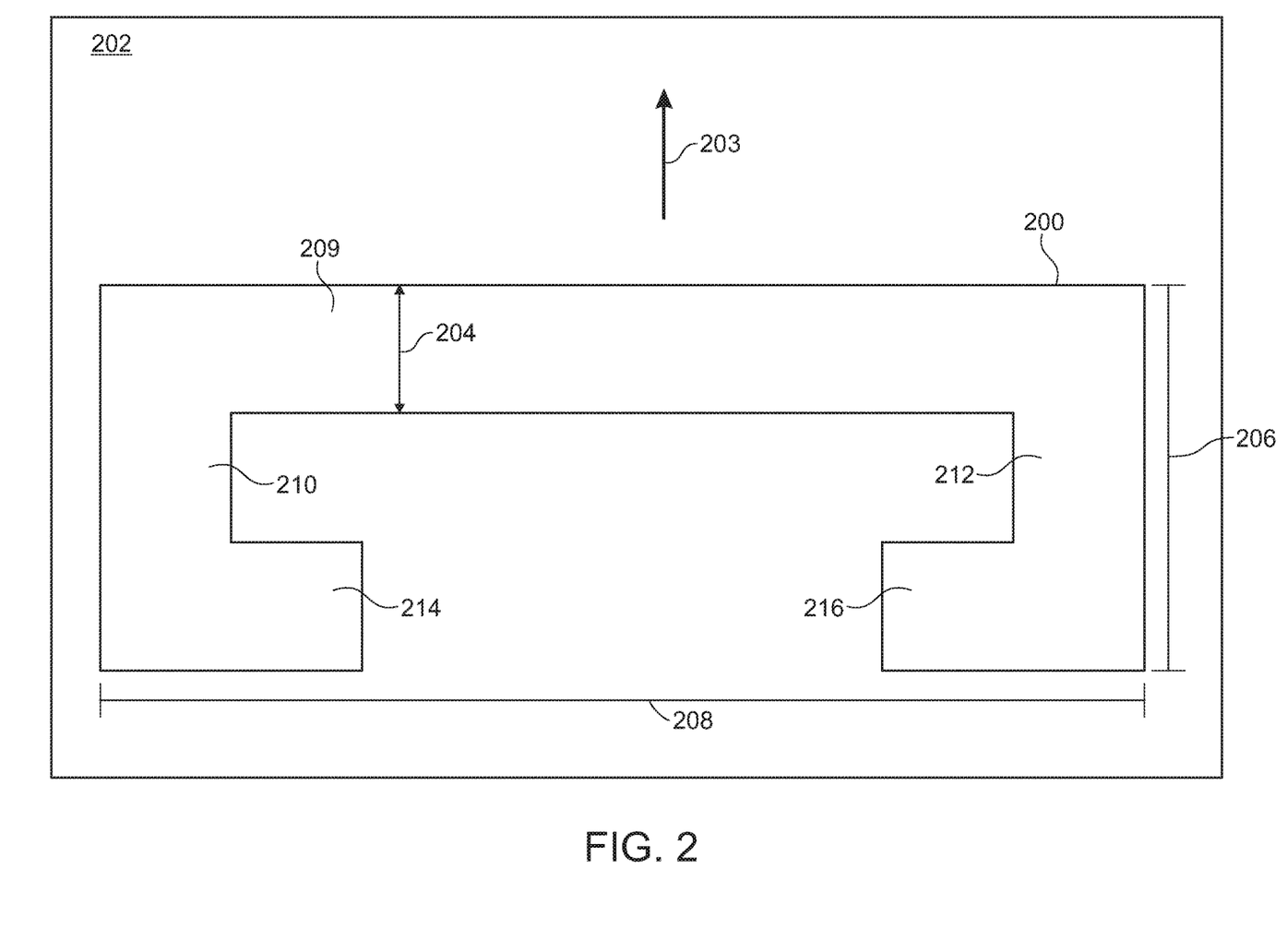
FIG. 2 is a layout diagram of a magnetoresistance element.

FIG. 2 is a layout diagram of an MR element 200. MR element 200 may include a plurality of material layers supported by (i.e. deposited and/or etched on) a surface of a semiconductor substrate 202. Although not shown, semiconductor substrate 202 may also support other circuits.

In this example, MR element 200 has a yoke shape to create an axis of maximum sensitivity in the direction of arrow 203 The yoke has a width 204 parallel to the surface of substrate 202. MR element also as an overall yoke width 206 and length 208.

In embodiments, the width 204 of all segments of MR element 200 is constant. For example, the width of beam 209 and legs 210, 212, 214, and 216 may all be the same. In other embodiments, different segments of MR element 200 may have different widths.

Figure 3:
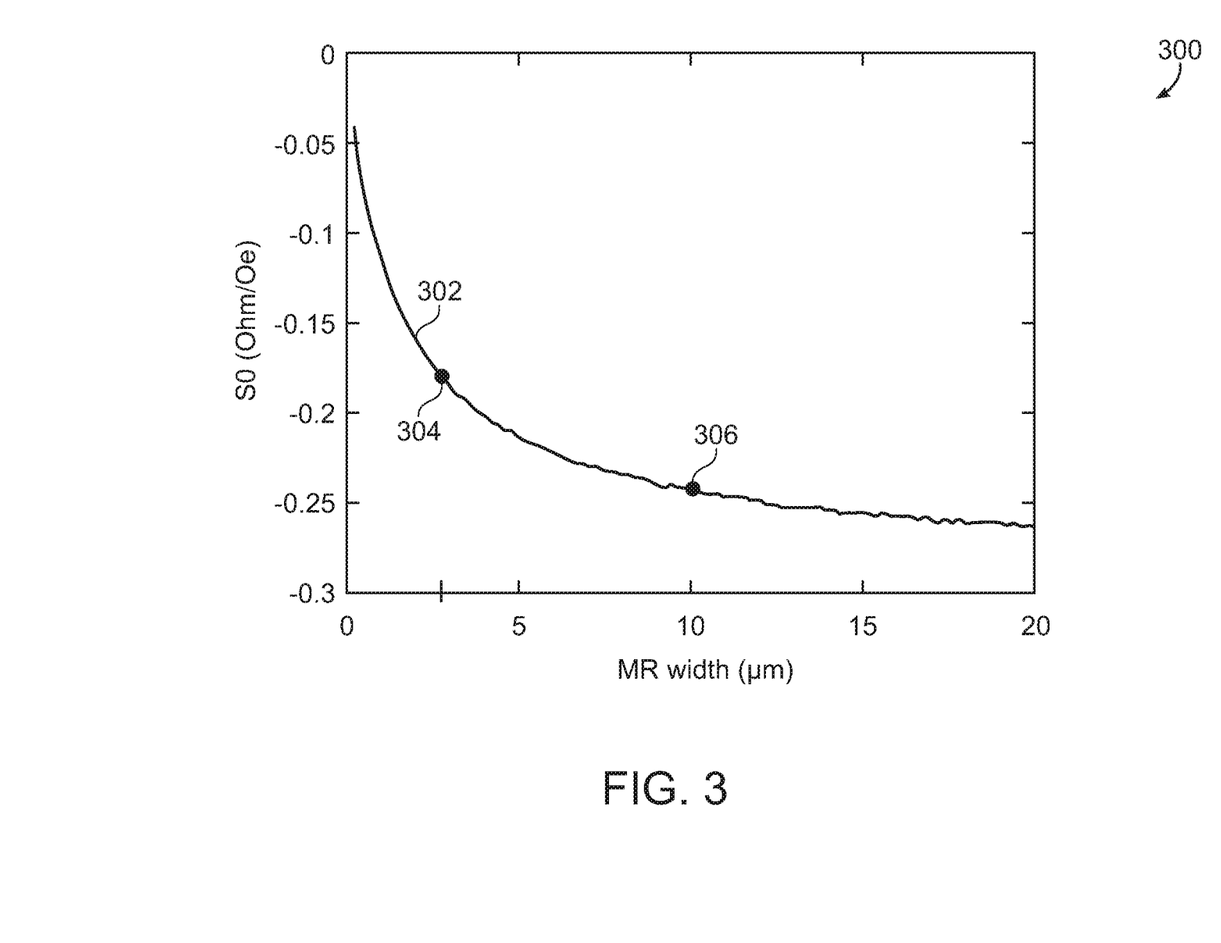
FIG. 3 is a plot of magnetic field sensitivity of magnetoresistance elements versus the width of the magnetoresistance elements.

Referring to FIG. 3, graph 300 includes a plot 302 of the sensitivity of an MR element to an external magnetic field versus width of the MR element. The sensitivity of an MR element may be described as the resistive reaction of the MR element to a magnetic field. As an example, an MR element with higher sensitivity may have more electrical resistance in the presence of a given magnetic field than that of an MR element with relatively less sensitivity.

The horizontal axis represents width of an MR element (e.g. width 204) in micrometers vertical axis represents sensitivity of the MR element in Ohms per Oersteds. Plot 302 indicates that, as the width of the MR element increases, the sensitivity of the MR element to an applied magnetic field also increases. For example, an MR element with a width of 2.5 micrometers (shown at point 304) has a lower sensitivity than an MR element with a width of 10 micrometers (shown at point 306).

Figure 4:
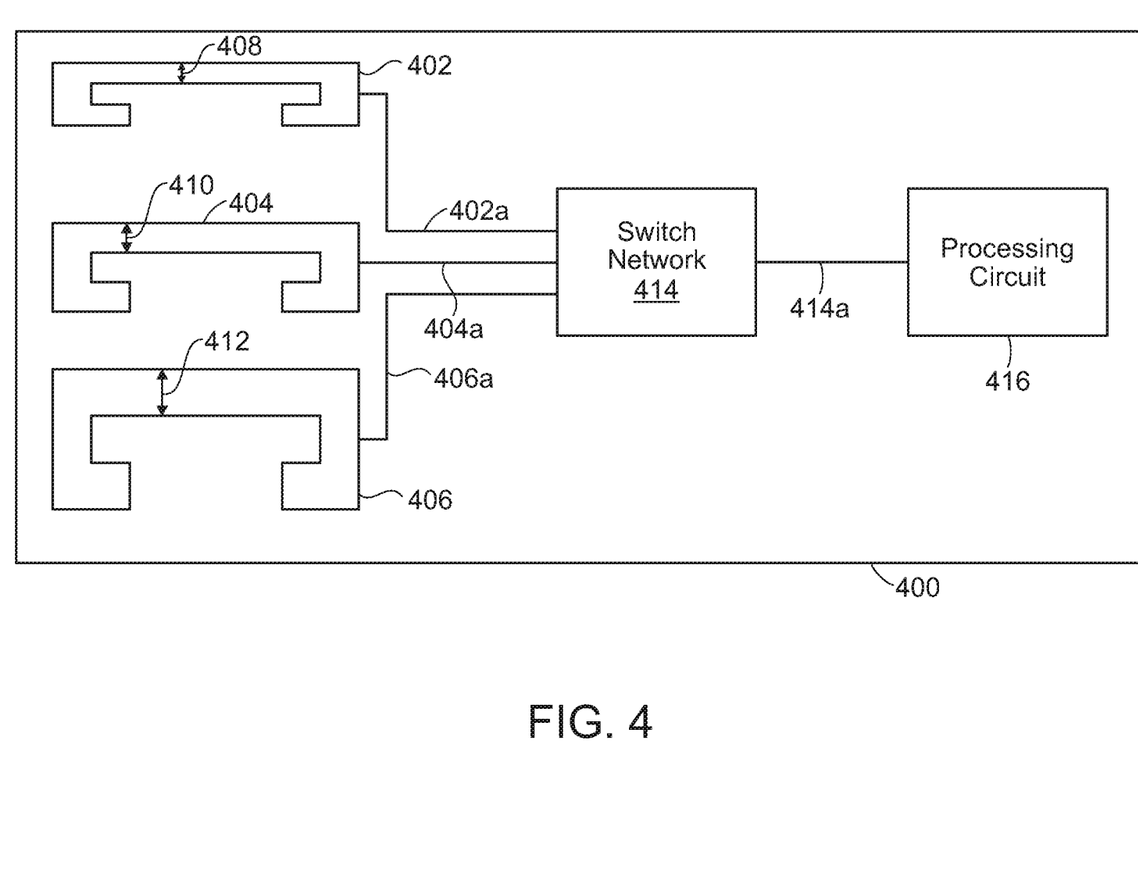
FIG. 4 is a block diagram of a magnetic field sensor having magnetic field sensing elements of varying sensitivities.

Referring to FIG. 4, magnetic field sensor 400 may be the same as or similar to magnetic field sensor 100 (see FIG. 1). Magnetic field sensor 400 may include a plurality of MR elements having various widths. In the example shown in FIG. 4, magnetic field sensor 400 includes three MR elements 402, 404, and 406 each having a different, respective width 408, 410, and 412. In other embodiments, magnetic field sensor 400 may include more of fewer MR elements. In embodiments, some of the MR elements may share the same width or all the MR elements may have different widths. In general, two (or more) of the MR elements included in magnetic field sensor 400 will have different widths.

Magnetic field sensor also includes a switch network 414 coupled to each of the MR elements. Switch network 414 may include one or more switch circuits to couple output signals 402a, 404a, and 406a of MR elements 402, 404, and/or 406 to switch network output signal 414a. In an embodiment, switch network 414 may act as a multi-input to single-output multiplexor.

Magnetic field sensor 400 may also include a processing circuit 416 to receive and process the signals from MR elements 402, 404, and 406. Processing circuit may be the same as or similar to processing circuit 112 (see FIG. 1).

In embodiments, magnetic field sensor may use a time-division multiplexing scheme to detect a magnetic field. During one time period, switch network 414 may direct the output 402a of MR element 402 to processing circuit 416. During another time period, switch network 414 may direct the output 404a of MR element 404 to processing circuit 416. During yet another time period, switch network 414 may direct the output 406a of MR element 406 to processing circuit 416. Other arrangements are also possible. For example, in other embodiments, processing circuit 416 may receive and process the output from one or more MR element simultaneously, process the output from one or more MR element using frequency multiplexing, or use another scheme for processing multiple output signals.

Figure 5:
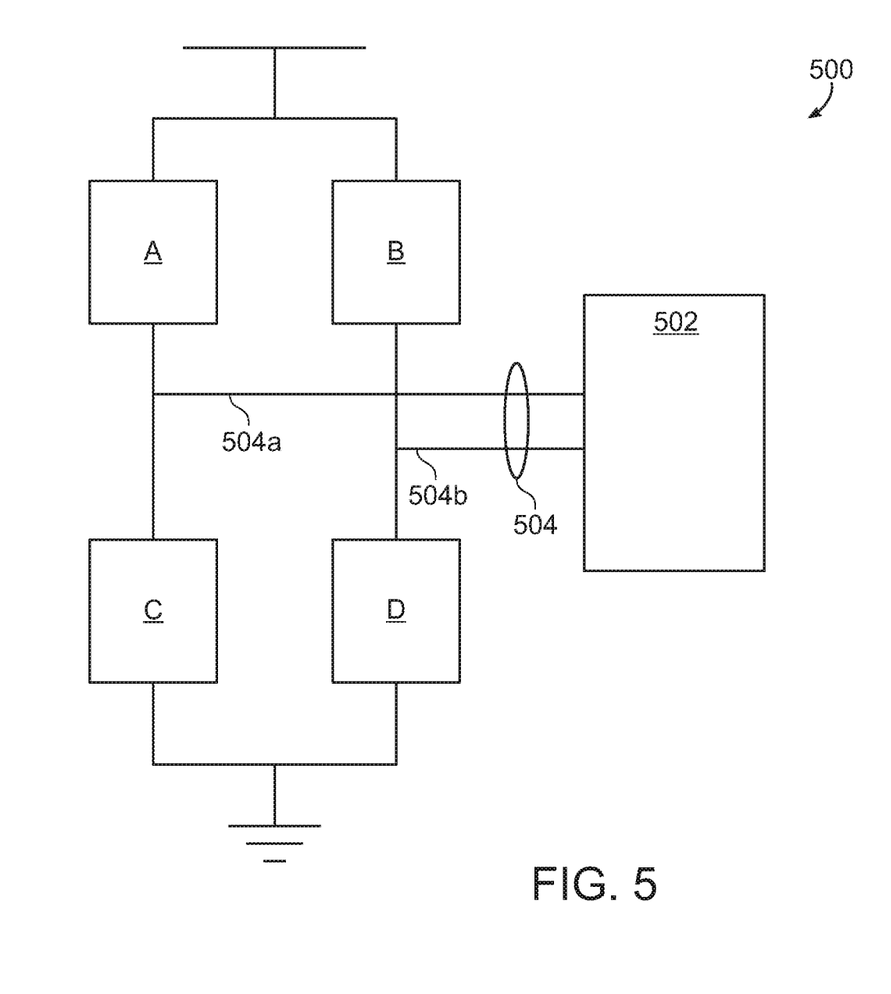
FIG. 5 is a block diagram of a magnetoresistance elements arranged in a bridge circuit.

Turning to FIG. 5, MR element circuit 500 includes MR elements A, B, C, and D arranged in a bridge configuration. The bridge circuit may produce output signal 504, which may be a differential output signal representing an external magnetic field detected by MR elements A, B, C, and D. In one configuration, MR elements A and D may have a relatively high sensitivity to the magnetic field while MR elements B and C have a relatively low sensitivity to the magnetic field. In this configuration, as the strength of the magnetic field increases, the voltage at signal 504b may increase relative to the and the voltage at signal 504a. As the strength of the magnetic field decreases, the voltage at signal 504b may decrease relative to the voltage at signal 504a. Circuit 500 also includes processing circuit 502 to receive and process signal 504.

In embodiments, MR elements A and D may have a relatively narrow width, providing them with a higher sensitivity to the magnetic field. Conversely, MR elements B and C may have a relatively wider width than MR elements A and D to provide MR elements B and C with a relatively lower sensitivity to the magnetic field. The differences in sensitivity due to the relatively narrow width of MR elements A and D and the relatively wide widths of MR elements B and C may provide the bridge circuit with the differential output described above.

In other embodiments, all MR elements A through D may have the same width.

Figure 5A:
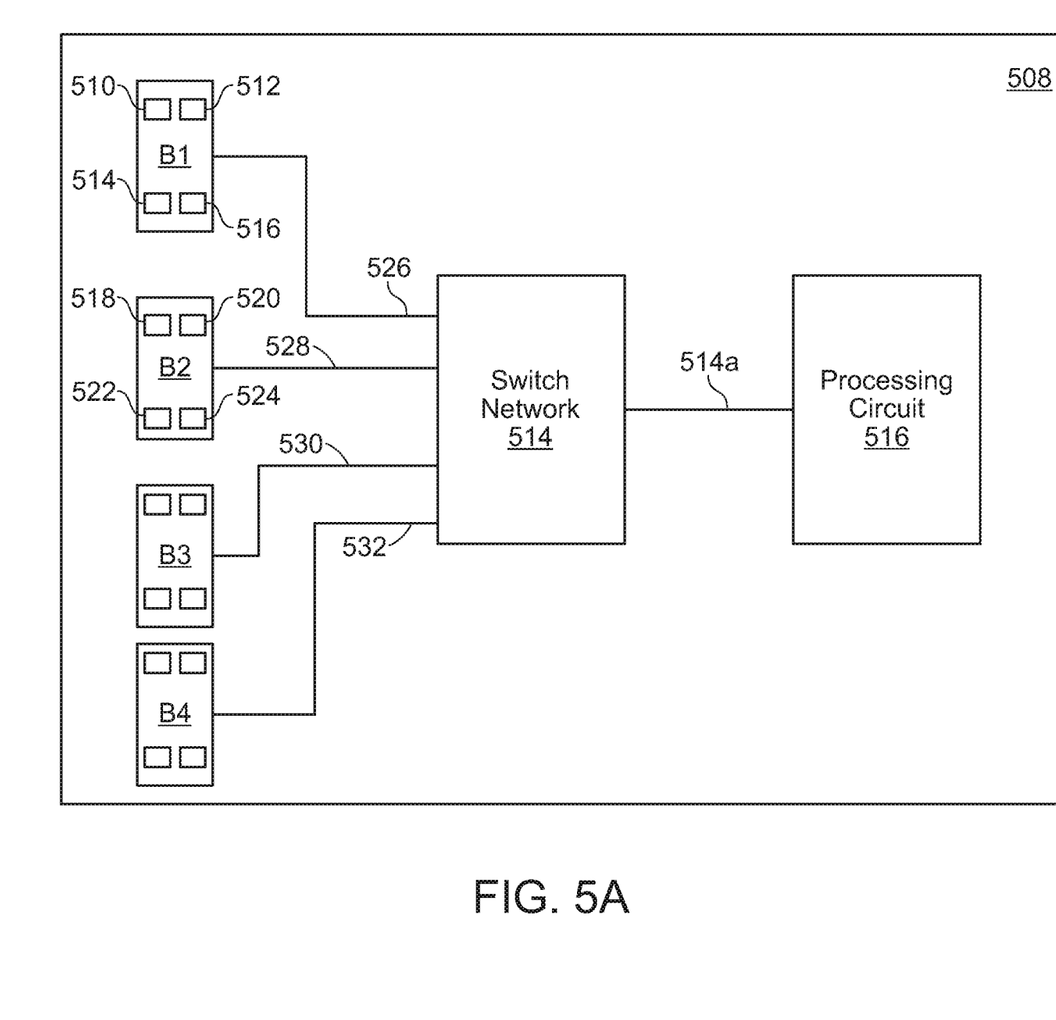
FIG. 5A is a block diagram of a magnetic field sensor having bridges circuits with magnetic field sensing elements of varying sensitivities.

Referring to FIG. 5A, magnetic field sensor 508 may be the same as or similar to magnetic field sensor 100 (see FIG. 1). Magnetic field sensor 500 may include a plurality of bridge circuits B1-B4. Each bridge circuit may comprise four MR elements arranged in a bridge configuration, like the bridge circuit comprising MR elements A-D in FIG. 5.

The MR elements in each bridge circuit may have the same width, and thus the same sensitivity. For example, MR elements 510, 512, 514, and 516 may all have the same width as each other, and MR elements 518, 520, 522, and 524 may all have the same width as each other. Also, the MR elements of bridge B1 (namely MR elements 510, 512, 514, and 516) may all have a different width, and thus a different sensitivity, than the MR elements of bridge B2 (namely MR elements 518, 520, 522, and 524). The MR elements of bridge B3 may have another, different width, and the MR elements of bridge B4 may have yet another width. Thus, each of the bridges B1-B4 may have a different sensitivity to an external magnetic field.

Magnetic field sensor 508 also includes a switch network 514 coupled to receive output signals from each of the bridges B1-B4. Switch network 514 may include one or more switch circuits to couple output signals 526, 528, 530, and 532 of bridges B1-B4 to switch network output signal 514a. In an embodiment, switch network 514 may act as a multi-input to single-output multiplexor.

Magnetic field sensor 508 may also include a processing circuit 516 to receive and process the signals from bridges B1-B4. Processing circuit 516 may be the same as or similar to processing circuit 112 (see FIG. 1).

In embodiments, magnetic field sensor may use a time-division multiplexing scheme to detect a magnetic field. During one time period, switch network 514 may direct the output 526 of bridge B1 to processing circuit 516. During another time period, switch network 514 may direct the output 528 of bridge B2 to processing circuit 516. During another time period, switch network 514 may direct the output 530 of bridge B3 to processing circuit 516. During yet another time period, switch network 514 may direct the output 532 of bridge B4 to processing circuit 516. Other arrangements are also possible. For example, in other embodiments, processing circuit 516 may receive and process the output from one or more of bridges B1-B4 simultaneously.

Figure 6:
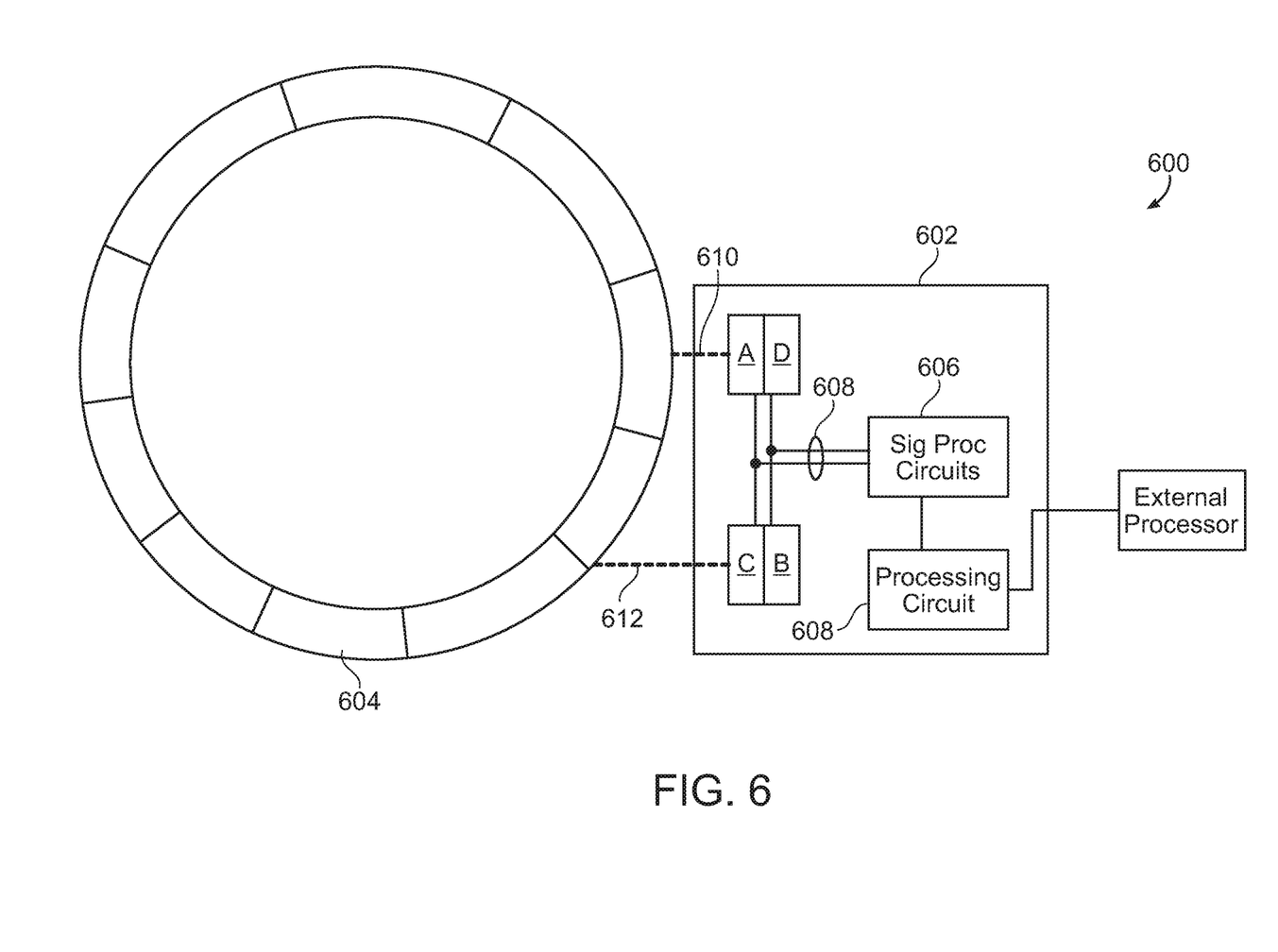
FIG. 6 is a block diagram of a system including a magnetic field sensor with magnetoresistance elements arranged in a bridge circuit.

FIG. 6 is a block diagram of a system 600 including a magnetic field sensor 602 positioned to detect a target 604. Although target 604 is shows as a ring magnet, target 604 may be any type of magnetic or non-magnetic target that can be detected by a magnetic field sensor including, but not limited to, a circular target, a toothed gear target, a rod or linear magnet, etc.

Magnetic field sensor 600 may be the same as or similar to magnetic field sensor 100 (see FIG. 1). Sensor 600 may include MR elements A, B, C, and D arranged in a bridge configuration, as described above. (see FIG. 5). Signal processing circuitry 606 may include filters, ADCs, and other circuits to shape the differential signal 608 received from the bridge. Processing circuit may calculate a state of target 604 based on the magnetic field signals received from the MR elements, similarly to processing circuit 112 described above. (see FIG. 1).

In embodiments, distance 610 of an air gap between target 604 and MR elements A and D may be less than the distance 612 of an air gap between target 604 and MR elements C and B. In this configuration, because magnetic field strength is inversely proportional to distance cubed, the magnetic field detected by MR elements A and D may be stronger than the magnetic field as detected by MR elements B and C. To compensate for the mismatch in magnetic field strength, MR elements A and/or D may have a relatively narrower width so that they are less sensitive to the magnetic field. MR elements B and/or C may have a relatively wider width so that they are relatively more sensitive to the magnetic field. The widths may be chosen so that, despite the different air gap distances 610 and 612, the resistance of MR elements A and D changes proportionally (e.g. with substantially similar value) to the resistance of MR elements B and C as the target's magnetic field changes.

Figure 7:
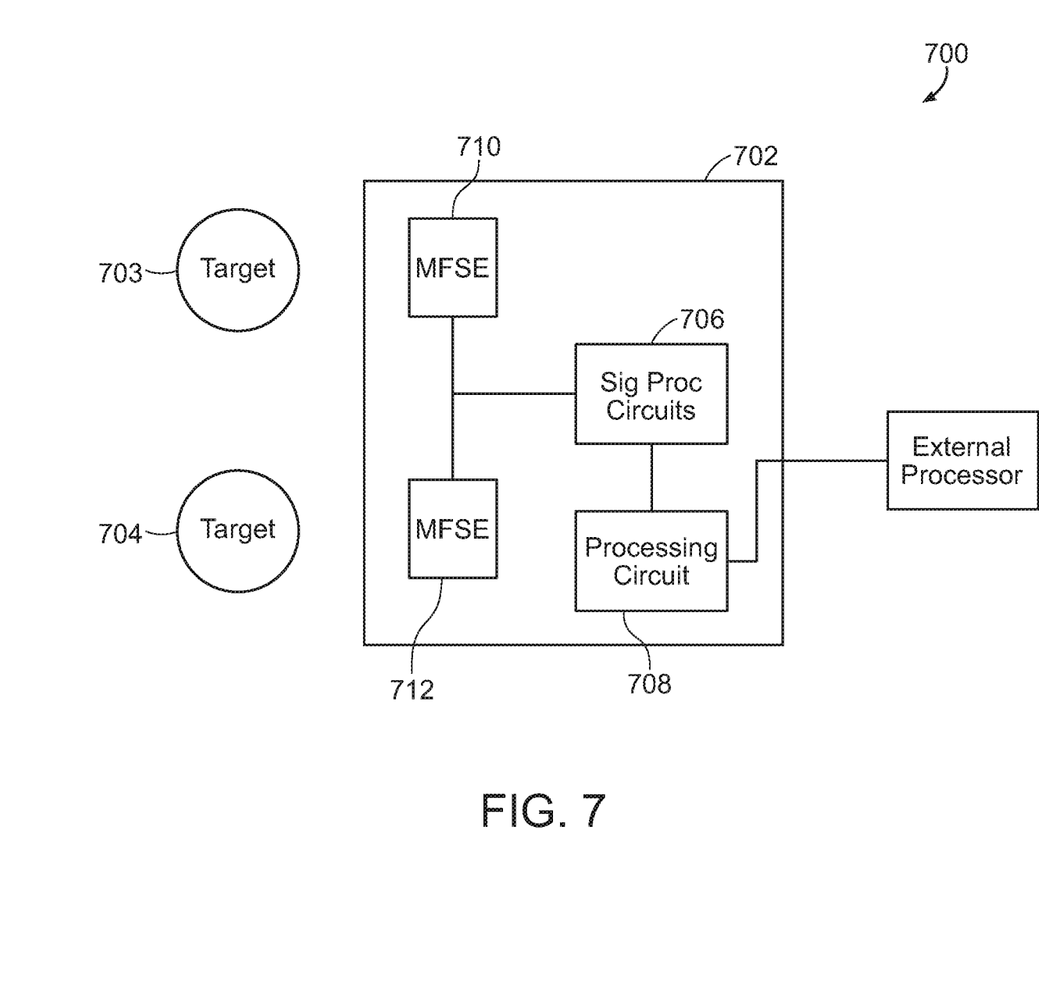
FIG. 7 is a block diagram of a system including a magnetic field sensor with magnetoresistance elements arranged in a bridge circuit.

FIG. 7 is a block diagram of a system 700 including a magnetic field sensor 702 positioned to detect targets 703 and 704. Magnetic field sensor 700 may be the same as or similar to magnetic field sensor 100 (see FIG. 1). Magnetic field sensor 700 may include MR element 710 positioned adjacent to target 703 and MR element 712 positioned adjacent to target 704. MR elements 710 and 712 are shows as single blocks, but may each represent one or a plurality of MR elements. For example, MR elements 710 and 712 may each represent a bridge circuit comprising four or more MR elements.

Signal processing circuitry 706 may include filters, ADCs, and other circuits to shape the signals received from the MR elements 710, 712. Processing circuit 708 may calculate a state of targets 703, 704 based on the magnetic field signals received from the MR elements, similarly to processing circuit 112 described above. (see FIG. 1).

In embodiments, the distance between MR element 710 and target 703 may be substantially the same as the distance between MR element 712 and target 704. Also, MR element 710 may have a width (or widths if MR element 710 represents multiple MR elements) different from the width (or widths) of MR element 712. Because of the different widths, MR element 710 may have a different sensitivity to detect target 703 than MR element 712 has to detect target 704.

In other embodiments, the air gap distance between target 703 and MR element 710 may be different than the air gap distance between target 704 and MR element 712. In this configuration, because magnetic field strength is inversely proportional to distance cubed, the magnetic field detected by MR elements 710 may detect target 703 with a different strength than MR element 712 detects target 704. In this case, the widths of MR elements 710 and 712 may be chosen so that, despite the different air gap distances, MR elements 710 and 712 have similar responsive resistances and provide output signals with similar amplitudes. Alternatively, the widths may be chosen so that the MR elements provide different responses and output signals with different amplitudes.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims. All references cited herein are hereby incorporated herein by reference in their entirety.

The invention claimed is:

1. A magnetic field sensor comprising:
a substrate having a surface;
a plurality of magnetoresistance elements supported by the surface of the substrate; each magnetoresistance element comprising:
a beam having a length that is equal to the length of the magnetoresistance element;
a first leg having a length shorter than the length of the beam and extending parallel to the beam along an axis;
a second leg having a length shorter than the length of the beam and extending parallel to the beam along the axis toward the first leg;
a third leg connected to a first end of the beam and the first leg;
a fourth leg connected to the second leg and a second end of the beam opposite the first end, the fourth leg being parallel to the third leg, each magnetoresistance element having a respective width parallel to the surface and equal to the width of the corresponding beam, each width being a smallest dimension parallel to the surface, wherein a first width of a first magnetoresistance element of the plurality of magnetoresistance elements is different from a second width of a second magnetoresistance element of the plurality of magnetoresistance elements;
a processing circuit coupled to the plurality of magnetoresistance elements to receive a signal representing a detected magnetic field from at least one of the magnetoresistance elements;
wherein each magnetoresistance element of the plurality of magnetoresistance elements is directly coupled to a respective input of the processing circuit.

2. The magnetic field sensor of claim 1 wherein the plurality of magnetoresistance elements comprises at least one giant-magnetoresistance element (GMR).

3. The magnetic field sensor of claim 1 wherein the plurality of magnetoresistance elements comprises at least one tunneling magnetoresistance element (TMR).

4. The magnetic field sensor of claim 1 wherein the plurality of magnetoresistance elements comprises at least one anisotropic magnetoresistance element (AMR).

5. The magnetic field sensor of claim 1 wherein each magnetoresistance element of the plurality of magnetoresistance elements has a different respective width.

6. The magnetic field sensor of claim 1 wherein the first width of the first magnetoresistance element provides the first magnetoresistance element with a first magnetic sensitivity, the second width of the second magnetoresistance element provides the second magnetoresistance element with a second magnetic sensitivity, wherein the first and second magnetic sensitivities are different.

7. The magnetic field sensor of claim 1 wherein the plurality of magnetoresistance elements is arranged to form one or more bridge circuits.

8. The magnetic field sensor of claim 7 wherein the first magnetoresistance element and the second magnetoresistance element are elements of a same bridge circuit.

9. The magnetic field sensor of claim 7 wherein the first magnetoresistance element is included in a first bridge circuit and the second magnetoresistance element is included in a second bridge circuit.

10. The magnetic field sensor of claim 9 wherein the first bridge circuit comprises magnetoresistance elements each having a width substantially equal to the first width and the second bridge circuit comprises magnetoresistance elements each having a width substantially equal to the second width.

11. The magnetic field sensor of claim 1 wherein the magnetic field sensor is responsive to a ring magnet or a circular magnet.

12. The magnetic field sensor of claim 1 wherein the first magnetoresistance element is positioned to detect a first ferromagnetic target with a first air gap between the ferromagnetic target and the first magnetoresistance element, and the second magnetoresistance element is positioned to detect a second ferromagnetic target with a second air gap between the magnetoresistance element and the second ferromagnetic target.

13. The magnetic field sensor of claim 12 wherein the first ferromagnetic target and the second ferromagnetic target are the same ferromagnetic target.

14. The magnetic field sensor of claim 1 further comprising a switching network coupled between the plurality of magnetoresistance elements and the processing circuit to selectively couple one or more of the magnetoresistance elements to the processing circuit.

15. A system comprising:
a target; and
a magnetic field sensor comprising:
a plurality of magnetoresistance elements supported by a surface of a substrate; each magnetoresistance element comprising:

a beam having a length that is equal to the length of the magnetoresistance element;
a first leg having a length shorter than the length of the beam and extending parallel to the beam along an axis;
a second leg having a length shorter than the length of the beam and extending parallel to the beam along the axis toward the first leg;
a third leg connected to a first end of the beam and the first leg;
a fourth leg connected to the second leg and a second end of the beam opposite the first end, the fourth leg being parallel to the third leg, each magnetoresistance element having a respective width parallel to the surface and equal to the width of the corresponding beam, a first magnetoresistance element of the plurality of magnetoresistance elements having a first width providing a first magnetic sensitivity, a second magnetoresistance element of the plurality of magnetoresistance elements having a second width providing a second magnetic sensitivity, the first width different than the second width and the first sensitivity different than the second sensitivity, the first and second widths being smallest respective dimensions parallel to a surface of a substrate; and
a processing circuit coupled to the plurality of magnetoresistance elements to receive a signal representing a detected magnetic field from at least one of the first or second magnetoresistance elements;
wherein each magnetoresistance element of the plurality of magnetoresistance elements is directly coupled to a respective input of the processing circuit; and
wherein the first magnetoresistance element is positioned with a first distance between the first magnetoresistance element and the target and the second magnetoresistance element is positioned with a second distance between the second magnetoresistance element and the ferromagnetic target.

16. The system of claim 15 wherein the first sensitivity is greater than the second sensitivity and the first distance is greater than the second distance.

17. A magnetic field sensor comprising:
a substrate having a surface;
detection means for detecting a magnetic field, the detection means configured to detect the magnetic field with varying sensitivity.

18. The magnetic field sensor of claim 17 wherein the detection means comprises means for detecting the magnetic field with a first sensitivity during a first time period and a second sensitivity during a second time period, wherein the first sensitivity is different than the second sensitivity and the first time period is different than the second time period.

19. The magnetic field sensor of claim 17 wherein the detecting means comprises one or more magnetic field sensing elements, wherein the magnetic field sensor further comprises means for detecting, by the one or more magnetic field sensing elements, the magnetic field with varying sensitivity.

* * * * *

UNITED STATES PATENT AND TRADEMARK OFFICE
CERTIFICATE OF CORRECTION

PATENT NO. : 10,605,874 B2  
APPLICATION NO. : 16/055644  
DATED : March 31, 2020  
INVENTOR(S) : Rémy Lassalle-Balier et al.

Page 1 of 1

It is certified that error appears in the above-identified patent and that said Letters Patent is hereby corrected as shown below:

In the Specification

Column 3, Line 53, delete "magnetic" and replace with --magnet--.

Column 3, Line 62, delete "rod" and replace with --a rod--.

Column 4, Line 23, delete "203" and replace with --203.--.

Column 4, Line 40, delete "micrometers vertical" and replace with --micrometers and the vertical--.

Column 5, Line 29, delete "relative to the and the" and replace with --relative to the--.

Column 6, Line 25, delete "shows" and replace with --shown--.

Column 6, Line 63, delete "shows" and replace with --shown--.

Signed and Sealed this  
Twentieth Day of October, 2020

Andrei Iancu  
*Director of the United States Patent and Trademark Office*